United States Patent
Satoskar et al.

(10) Patent No.: US 9,391,576 B1
(45) Date of Patent: Jul. 12, 2016

(54) ENHANCEMENT OF DYNAMIC RANGE OF AUDIO SIGNAL PATH

(71) Applicant: Cirrus Logic, Inc., Austin, TX (US)

(72) Inventors: Aniruddha Satoskar, Austin, TX (US); Daniel John Allen, Austin, TX (US); Tejasvi Das, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 140 days.

(21) Appl. No.: 14/083,972

(22) Filed: Nov. 19, 2013

Related U.S. Application Data

(60) Provisional application No. 61/874,014, filed on Sep. 5, 2013.

(51) Int. Cl.
*H03G 7/00* (2006.01)
*H03M 1/00* (2006.01)
(Continued)

(52) U.S. Cl.
CPC ............. *H03G 3/3026* (2013.01); *H03G 3/001* (2013.01); *H03G 3/002* (2013.01); *H03M 1/186* (2013.01); *H03M 1/70* (2013.01)

(58) Field of Classification Search
CPC ..... H03G 3/001; H03G 3/002; H03G 3/3026; H03M 1/70; H03M 2201/14; H03M 2201/60; H03M 2201/6114; H03M 2201/6128; H03M 2201/64; H03M 2201/642; H03M 1/18; H03M 1/186; H03M 1/68; H03M 3/492; H03M 2201/61; H03M 2201/6135; H03M 2201/721
USPC ........................... 381/106; 341/139, 140, 143
See application file for complete search history.

(56) References Cited

U.S. PATENT DOCUMENTS

| 4,446,440 A | 5/1984 | Bell |
| 4,972,436 A | 11/1990 | Halim et al. |

(Continued)

FOREIGN PATENT DOCUMENTS

| EP | 0966105 A2 | 12/1999 |
| EP | 1753130 A1 | 2/2007 |

(Continued)

OTHER PUBLICATIONS

International Search Report and Written Opinion, International Application No. PCT/US2015/056357, mailed Jan. 29, 2015, 13 pages.

(Continued)

*Primary Examiner* — Davetta W Goins
*Assistant Examiner* — Daniel Sellers
(74) *Attorney, Agent, or Firm* — Jackson Walker L.L.P.

(57) ABSTRACT

In accordance with embodiments of the present disclosure, an apparatus for providing an output signal to an audio transducer may include an analog signal path portion, a digital-to-analog converter (DAC), and a control circuit. The analog signal path portion may have an audio input for receiving an analog input signal, an audio output for providing the output signal, and a selectable analog attenuation, and may be configured to generate the output signal based on the analog input signal and in conformity with the selectable analog attenuation. The DAC may have a selectable digital gain and may be configured to convert a digital audio input signal into the analog input signal in conformity with the selectable digital gain. The control circuit may be configured to select the selectable analog attenuation and select the selectable digital gain based on a magnitude of a signal indicative of the output signal.

43 Claims, 2 Drawing Sheets

(51) Int. Cl.
  *H03G 3/30* (2006.01)
  *H03M 1/18* (2006.01)
  *H03G 3/00* (2006.01)
  *H03M 1/70* (2006.01)

(56) References Cited

U.S. PATENT DOCUMENTS

| | | | |
|---|---|---|---|
| 4,999,628 A | 3/1991 | Kakubo et al. | |
| 4,999,830 A | 3/1991 | Agazzi | |
| 5,148,167 A | 9/1992 | Ribner | |
| 5,321,758 A | 6/1994 | Charpentier et al. | |
| 5,323,159 A | 6/1994 | Imamura et al. | |
| 5,550,923 A | 8/1996 | Hotvet | |
| 5,600,317 A | 2/1997 | Knoth et al. | |
| 5,714,956 A | 2/1998 | Jahne et al. | |
| 5,808,575 A | 9/1998 | Himeno et al. | |
| 6,088,461 A * | 7/2000 | Lin | H03G 3/001 381/104 |
| 6,201,490 B1 | 3/2001 | Kawano et al. | |
| 6,271,780 B1 | 8/2001 | Gong et al. | |
| 6,353,404 B1 | 3/2002 | Kuroiwa | |
| 6,768,443 B2 | 7/2004 | Willis | |
| 6,853,242 B2 | 2/2005 | Melanson et al. | |
| 6,888,888 B1 | 5/2005 | Tu et al. | |
| 7,023,268 B1 | 4/2006 | Taylor et al. | |
| 7,061,312 B2 | 6/2006 | Andersen et al. | |
| 7,167,112 B2 | 1/2007 | Andersen et al. | |
| 7,216,249 B2 | 5/2007 | Fujiwara et al. | |
| 7,403,010 B1 | 7/2008 | Hertz | |
| 7,522,677 B2 | 4/2009 | Liang | |
| 7,583,215 B2 | 9/2009 | Yamamoto et al. | |
| 8,060,663 B2 | 11/2011 | Murray et al. | |
| 8,289,425 B2 | 10/2012 | Kanbe | |
| 8,330,631 B2 | 12/2012 | Kumar et al. | |
| 8,362,936 B2 | 1/2013 | Ledzius et al. | |
| 8,717,211 B2 | 5/2014 | Miao et al. | |
| 9,071,267 B1 | 6/2015 | Schneider et al. | |
| 9,071,268 B1 | 6/2015 | Schneider et al. | |
| 9,148,164 B1 | 9/2015 | Schneider et al. | |
| 2004/0184621 A1 | 9/2004 | Andersen et al. | |
| 2005/0258989 A1 | 11/2005 | Li et al. | |
| 2006/0056491 A1 | 3/2006 | Lim et al. | |
| 2007/0057720 A1 | 3/2007 | Hand et al. | |
| 2007/0092089 A1 * | 4/2007 | Seefeldt | G10L 25/48 381/104 |
| 2007/0120721 A1 | 5/2007 | Caduff et al. | |
| 2008/0159444 A1 | 7/2008 | Terada | |
| 2009/0021643 A1 | 1/2009 | Hsueh et al. | |
| 2009/0058531 A1 | 3/2009 | Hwang et al. | |
| 2009/0220110 A1 * | 9/2009 | Bazarjani | H03F 1/0211 381/120 |
| 2011/0025540 A1 | 2/2011 | Katsis | |
| 2011/0096370 A1 | 4/2011 | Okamoto | |
| 2011/0150240 A1 | 6/2011 | Akiyama et al. | |
| 2011/0170709 A1 | 7/2011 | Guthrie et al. | |
| 2011/0242614 A1 | 10/2011 | Okada | |
| 2012/0133411 A1 * | 5/2012 | Miao | H03G 3/001 327/306 |
| 2012/0177226 A1 | 7/2012 | Silverstein et al. | |
| 2012/0188111 A1 * | 7/2012 | Ledzius | H03M 1/70 341/144 |
| 2012/0207315 A1 | 8/2012 | Kimura et al. | |
| 2012/0242521 A1 | 9/2012 | Kinyua | |
| 2012/0280726 A1 | 11/2012 | Colombo et al. | |
| 2013/0106635 A1 | 5/2013 | Doi | |
| 2013/0188808 A1 * | 7/2013 | Pereira | H03G 3/3089 381/107 |
| 2014/0105256 A1 | 4/2014 | Hanevich et al. | |
| 2014/0184332 A1 | 7/2014 | Shi et al. | |
| 2015/0295584 A1 | 10/2015 | Das et al. | |
| 2015/0381130 A1 | 12/2015 | Das et al. | |

FOREIGN PATENT DOCUMENTS

| | | |
|---|---|---|
| GB | 2307121 A | 6/1997 |
| GB | 2507096 A | 4/2014 |
| GB | 2527637 A | 12/2015 |
| WO | WO0054403 A1 | 9/2000 |
| WO | WO0237686 A2 | 5/2002 |
| WO | 2008067260 A1 | 6/2008 |
| WO | 2015160655 A1 | 10/2015 |

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

GB Patent Application No. 1419651.3, Improved Analogue-to-Digital Convertor, filed Nov. 4, 2014, 65 pages.

Combined Search and Examination Report, GB Application No. GB1506258.1, Oct. 21, 2015, 6 pages.

International Search Report and Written Opinion, International Patent Application No. PCT/US2015/025329, mailed Aug. 11, 2015, 9 pages.

Combined Search and Examination Report, GB Application No. GB1510578.6, Aug. 3, 2015, 2015, 3 pages.

International Search Report and Written Opinion, International Patent Application No. PCT/US2015/048633, mailed Dec. 10, 2015, 11 pages.

International Search Report and Written Opinion, International Patent Application No. PCT/US2015/048591, mailed Dec. 10, 2015, 11 pages.

International Search Report and Written Opinion, International Application No. PCT/US2015/048609, mailed Mar. 23, 2016, 23 pages.

Combined Search and Examination Report, UK Application No. GB1514512.1, Feb. 11, 2016, 7 pages.

\* cited by examiner

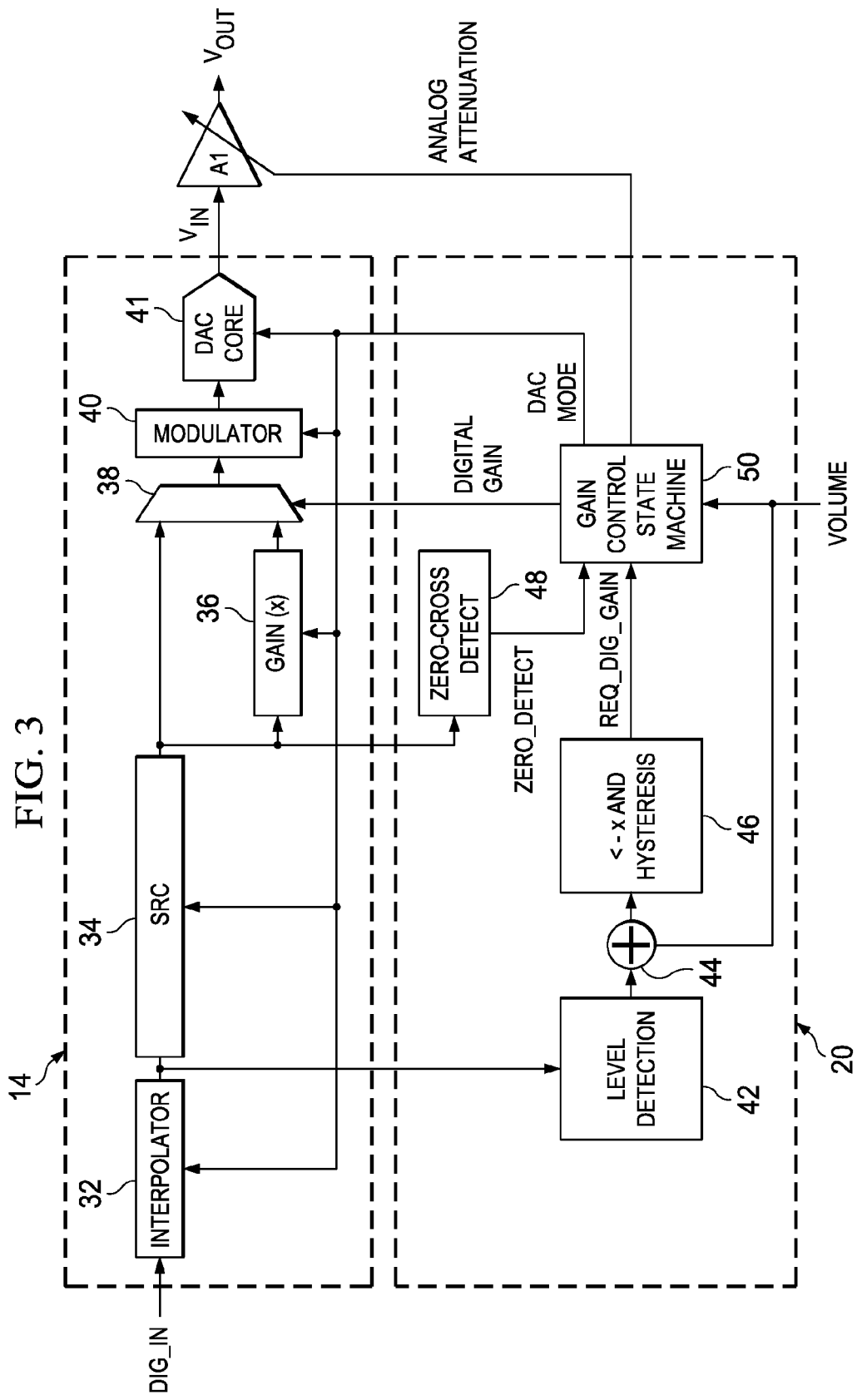

ENHANCEMENT OF DYNAMIC RANGE OF AUDIO SIGNAL PATH

RELATED APPLICATION

The present disclosure claims priority to U.S. Provisional Patent Application Ser. No. 61/874,014, filed Sep. 5, 2013, which is incorporated by reference herein in its entirety.

FIELD OF DISCLOSURE

The present disclosure relates in general to circuits for audio devices, including without limitation personal audio devices such as wireless telephones and media players, and more specifically, to systems and methods for enhancing a dynamic range of an audio signal path in an audio device by applying signal-based gain control to a digital gain and an analog gain of the signal path.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device which may affect its marketability and desirability is the dynamic range of its audio output signal. Stated simply, the dynamic range is the ratio between the largest and smallest values of the audio output signal. One way to increase dynamic range is to apply a high gain to the power amplifier. However, noise present in an audio output signal may be a generally monotonically increasing function of the gain of amplifier A1, such that any increased dynamic range as a result of a high-gain amplifier may be offset by signal noise which may effectively mask lower-intensity audio signals.

SUMMARY

In accordance with the teachings of the present disclosure, one or more disadvantages and problems associated with existing approaches to maintaining a high dynamic range of an audio signal path may be reduced or eliminated.

In accordance with embodiments of the present disclosure, an apparatus for providing an output signal to an audio transducer may include an analog signal path portion, a digital-to-analog converter (DAC), and a control circuit. The analog signal path portion may have an audio input for receiving an analog input signal, an audio output for providing the output signal, and a selectable analog attenuation, and may be configured to generate the output signal based on the analog input signal and in conformity with the selectable analog attenuation. The DAC may have a selectable digital gain and may be configured to convert a digital audio input signal into the analog input signal in conformity with the selectable digital gain. The control circuit may be configured to select the selectable analog attenuation and select the selectable digital gain based on a magnitude of a signal indicative of the output signal.

In accordance with these and other embodiments of the present disclosure, a method for providing an output signal to an audio transducer may include receiving a signal indicative of the output signal. The method may also include selecting a selectable analog attenuation based on a magnitude of the signal indicative of the output signal, wherein the output signal is generated based on an analog input signal and in conformity with the selectable analog attenuation. The method may further include selecting a selectable digital gain based on a magnitude of the signal indicative of the output signal, wherein a digital audio input signal is converted into the analog input signal in conformity with the selectable digital gain.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 is a block diagram of selected components of a gain control circuit for use within the audio integrated circuit depicted in FIG. 2, and selected components of an audio integrated circuit which may be coupled to the gain control circuit, in accordance with embodiments of the present disclosure.

DETAILED DESCRIPTION

Figure 1:
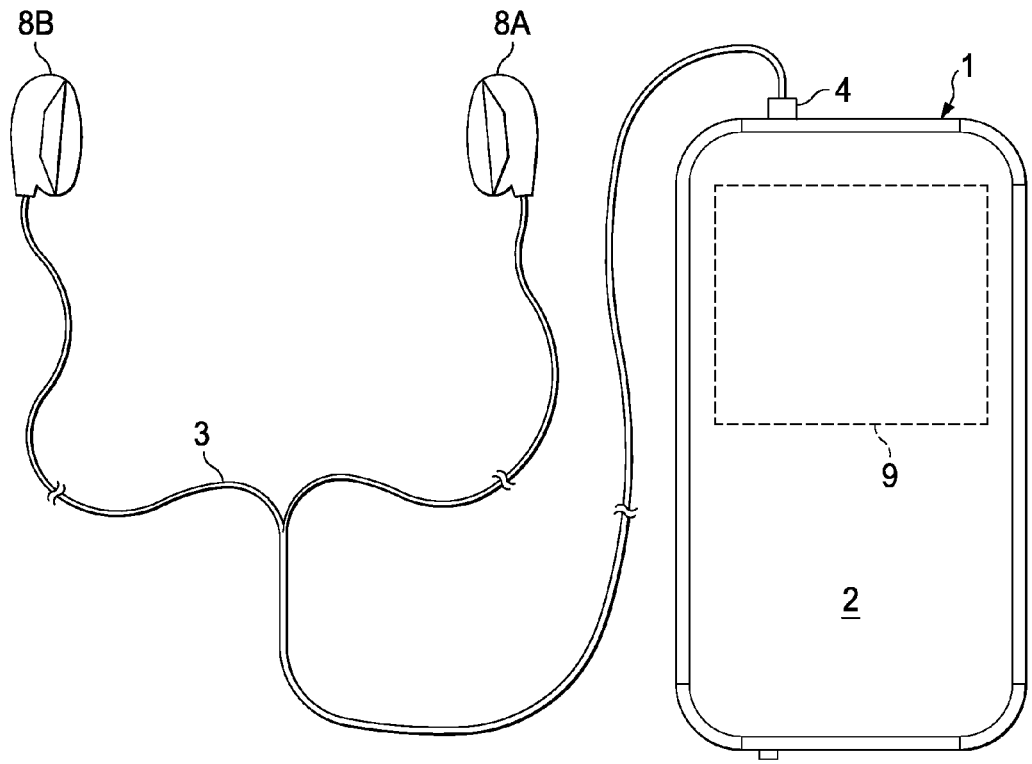
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
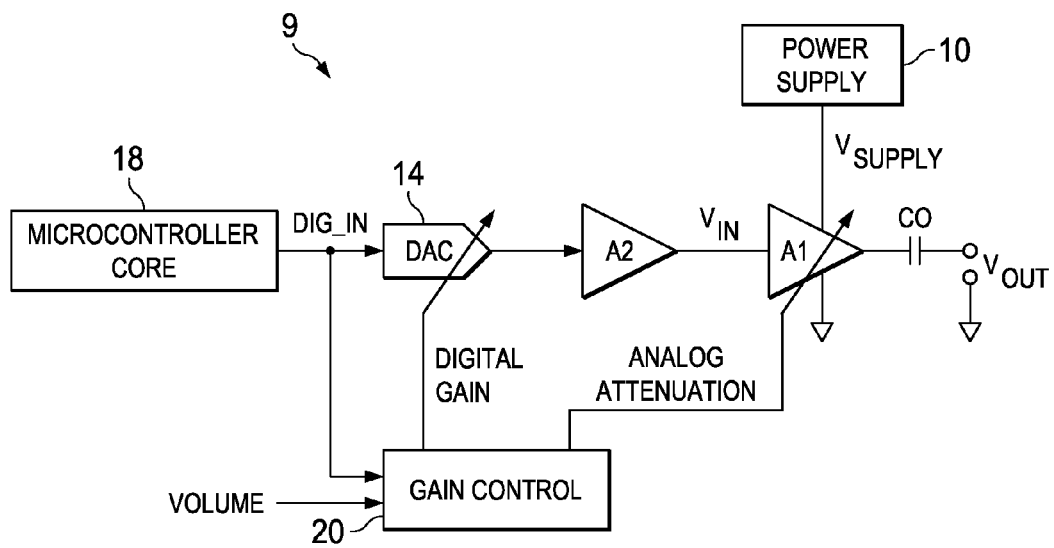
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may in turn supply an analog audio input signal $V_{IN}$ to a power amplifier stage A1 which may amplify or attenuate the audio input signal $V_{IN}$ and provide an audio output signal $V_{OUT}$, which may operate a speaker, headphone transducer, and/or a line level signal output. A capacitor CO may be utilized to couple the output signal to the transducer or line level output, particularly if amplifier A1 is operated from a unipolar power supply having a quiescent voltage substantially differing from ground. A power supply 10 may provide the power supply rail inputs of amplifier A1. In some embodiments, power supply 10 may comprise a charge pump power supply.

As shown in FIG. 2, audio IC 9 may include a gain control circuit 20 configured to, based on digital audio input signal DIG_IN (and, in some embodiments, the volume control setting in addition to digital audio input signal DIG_IN), control a programmable digital gain of DAC 14 and a programmable analog attenuation of amplifier A1. In embodiments in which a volume control is present, a volume control signal may be provided from a microcontroller or other digital control circuit responsive to a user interface, volume knob encoder or program command, or other suitable mechanism.

As an example of the functionality of gain control circuit 20, when a sum of a magnitude of digital audio input signal DIG_IN and a magnitude of a volume control setting is at or near zero decibels (dB) relative to the full-scale magnitude of the digital audio input signal, gain control circuit 20 may apply a unity gain (0 dB) to both of the digital gain and the analog attenuation (although the analog attenuation may be further modified based on the volume control setting). However, if the sum of the magnitude of the digital audio input signal DIG_IN and the magnitude of the volume control setting is below a particular predetermined threshold magnitude relative to the full-scale magnitude of digital audio input signal DIG_IN (e.g., −20 dB), gain control circuit 20 may apply a non-unity digital gain (e.g., 20 dB) to the digital gain and a corresponding non-unity attenuation (e.g., −20 dB) to the analog attenuation (although the analog attenuation may be further modified based on a volume control setting). Such approach may increase the dynamic range of audio IC 9 compared to approaches in which the digital gain and analog attenuation are static, as it may reduce the noise injected into audio output signal $V_{OUT}$, which noise may be a generally monotonically increasing function of the gain/attenuation of amplifier A1. While such noise may be negligible for higher magnitude audio signals (e.g., at or near 0 dB), the presence of such noise may become noticeable for lower magnitude audio signals (e.g., at or near −20 dB or lower). By applying an analog attenuation at amplifier A1, the amount of noise injected into audio output signal $V_{OUT}$ may be reduced, while the signal level of audio output signal $V_{OUT}$ may be maintained in accordance with the digital audio input signal DIG_IN through application of a digital gain to DAC 14 equal in magnitude to the analog attenuation.

FIG. 3 is a block diagram of selected components of an example gain control circuit 20 for use within audio IC 9, and selected components of audio IC 9 which may be coupled to gain control circuit 20, in accordance with embodiments of the present disclosure. As shown in FIG. 3, an audio signal path within DAC 14 may include an interpolator 32, a sample rate converter (SRC) 34, a modulator 40, and a DAC core 41, as is known in the art. Interposed between SRC 34 and modulator 40 may be a gain element 36 and a multiplexer 38. Gain element 36 may be configured to apply a gain of x (where x may be given in dB) to an output signal of SRC 34, thus increasing the magnitude of such signal. Multiplexer 38 may select between the digitally-amplified output signal generated by gain element 36 or the unamplified output signal from SRC 34 based on the digital gain signal received from gain control circuit 20, and output such selected signal to modulator 40.

As shown in FIG. 3, gain control circuit 20 may include a level detection circuit 42, a combiner 44, a comparator 46, a zero-cross detection circuit 48, and a gain control state machine 50. Level detection circuit 42 may include any suitable system, device, or apparatus for receiving an output signal of interpolator 32 and/or SRC 34, determining a magnitude of such output signal, and outputting a signal indicative of such magnitude (which will also be indicative of a magnitude of digital audio input signal DIG_IN). Combiner 44 may include any suitable system, device, or apparatus for receiving the output signal from level detection circuit 42 indicative of the magnitude of digital audio input signal DIG_IN and receiving a volume control signal and summing these two signals to generate an output signal indicative of a desired magnitude of audio output signal $V_{OUT}$. Comparator 46 may compare the output signal of combiner 44 with a predetermined threshold magnitude (e.g., relative to a full-scale magnitude of digital audio input signal DIG_IN and/or audio output signal $V_{OUT}$), and based on such comparison, output a signal REQ_DIG_GAIN indicative of whether the desired magnitude of audio output signal $V_{OUT}$ is greater or lesser than such predetermined threshold magnitude. In some embodiments, comparator 46 may implement hysteresis, such that output signal REQ_DIG_GAIN may only transition if the output signal of combiner 44 remains above or below the predetermined threshold magnitude for a minimum duration of time (e.g., 0.1 seconds to place any switching artifacts outside the human-perceptible audio range). Zero-cross detection circuit 48 may include any suitable system, device, or apparatus for detecting the occurrence of a zero crossing of a signal in the signal path of audio IC 9, including, as shown in FIG. 3, the output signal of SRC 34 and outputting a signal ZERO_DETECT indicating that a zero crossing has occurred.

Gain control state machine 50 may receive the volume control signal and signals REQ_DIG_GAIN and ZERO_DETECT and based on such signals, generate the digital gain signal and analog attenuation signal, as described in greater detail elsewhere in this disclosure. For example, when the sum of the magnitude of digital audio input signal DIG_IN and the magnitude of the volume control signal transitions from above to below the predetermined threshold magnitude (e.g., −20 dB), signal REQ_DIG_GAIN may be asserted and in response gain control state machine 50 may wait until the occurrence of a zero crossing (as indicated by signal ZERO_DETECT) or crossing of another level within a threshold of zero and indicative of a zero crossing (e.g., a low signal level of lower than −70 dB or within a small number of least significant bits of zero), after which it may cause DAC 14 to apply a non-unity digital gain (x, given in dB) to its signal path and cause amplifier A1 to apply an analog attenuation equal to the sum of the magnitude of the volume control setting (y, given in dB) and the inverse of the digital gain (−x, given in dB). Gain control state machine 50 may enable the non-unity digital gain and non-unity analog attenuation in response to a zero crossing of the audio signal so that the change between gain modes occurs when the signal magnitude is small, and therefore auditory artifacts associated with the mode change may be less noticeable to a listener of an audio device including audio IC 9.

As another example, when the sum of the magnitude of digital audio input signal DIG_IN and the magnitude of the volume control signal transitions from below to above the predetermined threshold magnitude (e.g., −20 dB), signal REQ_DIG_GAIN may be deasserted, and in response gain control state machine 50 may cause DAC 14 to apply a unity digital gain (e.g., 0 dB) to its signal path and cause amplifier A1 to apply a unity analog attenuation equal to the volume control setting (e.g., 0 dB additional analog attenuation). However, when transitioning to this unity gain mode, it may not be desirable to wait for a zero cross of the output signal, as a transition from below to above the predetermined threshold magnitude may almost immediately lead to clipping of the audio signal.

In some embodiments, gain control state machine 50 may remove the non-unity digital gain and non-unity analog attenuation in one step while taking into account any latency associated with modulator 40. In other embodiments, gain control state machine 50 may remove the non-unity digital gain in one step and ramp the non-unity analog attenuation to a unity analog attenuation over time, wherein such ramp times may model the inverse of the amplifier A2 response to the step function created by removal of the non-unity digital gain.

In yet other embodiments, gain control state machine 50 or another component of audio IC 9 may predict the transition from the non-unity gain mode to the unity gain mode and ramp the non-unity digital gain towards unity and the non-unity analog attenuation towards unity in response to such prediction. In such embodiments, analysis of digital audio input signal DIG_IN, the output signal of interpolator 32, or another intermediate signal in the audio signal path may indicate that a transition is imminent. In addition, a buffer region may be applied to the digital gain and audio signal level (e.g., a digital gain of 10 dB when the audio signal is below −20 dB and 20 dB when the audio signal is below −40 dB). The output of SRC 34 may be used to monitor when the audio signal enters the buffer region, and in response thereto, gain control state machine 50 or another component of audio IC 9 may decrease the digital gain and decrease the analog attenuation in small steps.

In alternative embodiments, audio IC 9 may employ a multi-path solution having at least two audio signal paths (e.g., from DIG_IN to $V_{OUT}$): one with unity digital gain and analog attenuation and another with a non-unity digital gain (e.g., 20 dB) and corresponding non-unity analog attenuation (e.g., −20 dB), wherein the output of one of the audio signal paths may be selected as the audio output signal $V_{OUT}$ based on the magnitude of the audio signal.

In these and other embodiments, a component of audio IC 9 may add pre-correction to the digital output of the signal path (e.g., output of DAC 14) to account for filtering performed on the step change that occurs as a result of the transition in modes, which may avoid a need to match a response of amplifier A2 in ramping the analog attenuation during a transition.

In these and other embodiments, a component of audio IC 9 may alter a response of amplifier A2 (e.g., increase the low-pass corner frequency of amplifier A2 or effectively bypass its filtering effect) during the duration in which digital gain is decreased from the non-unity gain to the unity gain.

In these and other embodiments, gain control state machine 50 or another component of gain control circuit 20 may generate a DAC mode signal. In such embodiments, the DAC mode signal may be based on the analog attenuation signal, and DAC 14 may operate in a plurality of modes based on the DAC signal. For instance, when the analog attenuation is below a threshold level (e.g., −40 dB), the DAC mode signal may be set in accordance with a low-power/high-noise mode, while when the analog attenuation is above a threshold level, the DAC mode signal may be set in accordance with a high-power/low-noise mode. To implement the plurality of modes, one or more components of DAC 14 (e.g., interpolator 32, SRC 34, gain element 36, modulator 40, DAC core 41) may be configured to operate at different levels of power consumption based on the DAC mode. For instance, such one or more components may operate at higher frequencies, higher currents, and/or lower effective internal resistances in the low-power/high-noise mode, while operating at lower frequencies, lower currents, and/or higher effective internal resistances in the high-power/low-noise mode. In other embodiments, DAC 14 may include a plurality of paths, each path corresponding to a DAC mode and each path including its own respective interpolator 32, SRC 34, gain element 35, multiplexer 38, modulator 40, and/or DAC core 41, wherein a single one of the plurality of paths is selected to process digital audio input signal DIG_IN based on the DAC mode. The presence of such a DAC mode based on analog attenuation may reduce power consumption of DAC 14, as use of the DAC mode permits DAC 14 to operate at a lower power consumption when the analog attenuation is sufficiently high, as the additional noise present in the lower-power mode of DAC 14 may be reduced or eliminated by the analog attenuation. Although the foregoing contemplates use of two DAC modes, any suitable number of DAC modes may be employed in audio IC 9.

Similarly, in these and other embodiments amplifier A1 may operate in a plurality of analog modes, wherein the analog mode is selected based on the analog attenuation. For instance, when the analog attenuation is below a threshold level (e.g., −40 dB), the analog mode may be set in accordance with a high-power/low-noise mode, while when the analog attenuation is above a threshold level, the analog mode may be set in accordance with a low-power/high-noise mode. As in the case of the DAC mode described above, analog modes may be implemented using multiple paths or may be implemented by varying frequencies, currents, effective internal resistances, and/or other suitable parameters of amplifier A1.

As a result of the various embodiments disclosed above, gain control circuit 20 may be configured to select the selectable analog attenuation and select the selectable digital gain such that the analog signal path portion operates at a highest possible attenuation in order to minimize analog thermal noise in an analog signal path portion of audio IC 9 which generates the audio output signal from the analog audio input signal.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An apparatus for providing an output signal to an audio transducer, comprising:
   an analog signal path portion having an audio input for receiving an analog input signal, an audio output for providing the output signal, and a selectable analog attenuation, and configured to generate the output signal based on the analog input signal and in conformity with the selectable analog attenuation;
   a digital-to-analog converter (DAC) having a selectable digital gain and configured to convert a digital audio input signal into the analog input signal in conformity with the selectable digital gain; and
   a control circuit configured to select the selectable analog attenuation and select the selectable digital gain based on a magnitude of a signal indicative of the output signal;
   wherein at least one of the analog signal path and the DAC is further configured to modify a response of the analog audio signal to reduce filtering effects occurring as a result of a change in the selectable digital gain.

2. The apparatus of claim 1, wherein the control circuit is configured to select the selectable analog attenuation and select the selectable digital gain such that the analog signal path portion operates at a highest possible attenuation in order to minimize analog noise in the analog signal path portion.

3. The apparatus of claim 1, wherein the signal indicative of the output signal is a sum of the digital audio input signal and a volume control setting signal.

4. The apparatus of claim 1, wherein the control circuit is further configured to select the selectable analog attenuation based on a magnitude of a volume control setting signal.

5. The apparatus of claim 1, wherein the product of the selectable digital gain and the selectable analog attenuation is a unity gain.

6. The apparatus of claim 1, wherein the control circuit is further configured to:
   select a first selectable digital gain as the selectable digital gain and select a first selectable analog attenuation as the selectable analog attenuation if the magnitude of the signal indicative of the output signal is above a predetermined threshold; and
   select a second selectable digital gain as the selectable digital gain and select a second selectable analog attenuation as the selectable analog attenuation if the magnitude of the signal indicative of the output signal is below the predetermined threshold, wherein the second selectable digital gain is greater than the first selectable digital gain and the first selectable analog attenuation is greater than the second selectable analog attenuation.

7. The apparatus of claim 6, wherein the product of the first selectable digital gain and the first selectable analog attenuation is a unity gain and the product of the second selectable digital gain and the second selectable analog attenuation is a unity gain.

8. The apparatus of claim 6, wherein the control circuit is further configured to:
   select the first selectable digital gain as the selectable digital gain and select a first selectable analog attenuation as the selectable analog attenuation if the magnitude of the signal indicative of the output signal exceeds the predetermined threshold for a first predetermined minimum duration of time; and
   select the second selectable digital gain as the selectable digital gain and select a second selectable analog attenuation as the selectable analog attenuation if the magnitude of the signal indicative of the output signal remains below the predetermined threshold for a second predetermined minimum duration of time.

9. The apparatus of claim 8, wherein the first predetermined minimum duration of time and the second predetermined minimum duration of time are approximately equal.

10. The apparatus of claim 6, wherein the control circuit is further configured to select the second selectable digital gain as the selectable digital gain and select the second selectable analog attenuation as the selectable analog attenuation responsive to the magnitude of the signal indicative of the output signal decreasing below the predetermined threshold and the signal indicative of the output signal crossing a zero crossing level.

11. The apparatus of claim 10, wherein the zero crossing level is zero or a level within a second predetermined threshold of zero and indicative of a zero crossing of the output signal.

12. The apparatus of claim 6, wherein the control circuit is further configured to select the first selectable digital gain as the selectable digital gain and transition the selectable analog attenuation between the second selectable gain and the first selectable gain during a duration of time responsive to the magnitude of the signal indicative of the output signal increasing above the predetermined threshold.

13. The apparatus of claim 12, wherein the duration of time models an inverse of a response of a power amplifier to the selection of the first selectable digital gain as the selectable digital gain; wherein the power amplifier is integral to an analog signal path portion and configured to generate the output signal.

14. The apparatus of claim 6, wherein the control circuit is further configured to transition the selectable digital gain between the second selectable gain and the first selectable gain during a duration of time and transition the selectable analog attenuation between the second selectable gain and the first selectable gain during the duration of time responsive to the magnitude of the signal indicative of the output signal increasing above the predetermined threshold.

15. The apparatus of claim 6, wherein the DAC comprises:
   an interpolator for receiving the digital audio input signal and generating an interpolated digital audio input signal;
   a sample rate converter for sample rate converting the interpolated digital audio input signal; and
   a modulator for modulating the sample rate converted interpolated digital audio input signal to generate the audio output signal;
   wherein the control circuit predicts a transition of the signal indicative of the audio output signal from below the predetermined threshold to above the predetermined threshold based on at least one of the digital audio input signal and the interpolated digital audio input signal and transitions the selectable digital gain between the second selectable digital gain and the first selectable digital gain in response to prediction of the transition of the signal indicative of the audio output signal from below the predetermined threshold to above the predetermined threshold.

16. The apparatus of claim 15, wherein the control circuit further:
   defines at least one buffer region of the sample rate converted interpolated digital audio input signal, wherein the selectable digital gain is selected to be a buffer region selectable gain greater than the second selectable gain and lesser than the first selectable gain when the sample rate converted interpolated digital audio input signal is within the buffer region; and transitions the selectable analog attenuation between the buffer region selectable gain and the first selectable gain during a duration of time responsive to the sample rate converted interpolated digital audio input signal being within the buffer region.

17. The apparatus of claim 1, wherein the DAC is configured to modify the response of the analog audio signal by applying a pre-correction factor to the analog audio signal to account for filtering occurring in the analog signal path portion as a result of decrease in the selectable digital gain from a first selectable digital gain to a second selectable digital gain.

18. The apparatus of claim 1, wherein the audio signal path portion comprises a power amplifier having an audio output for providing the output signal, and wherein the power amplifier is:

configured to generate the output signal in conformity with the selectable analog attenuation; and modify the response of the analog audio signal by altering its response to reduce low-pass filtering effects of the power amplifier in response to decrease in the selectable digital gain from a first selectable digital gain to a second selectable digital gain.

19. The apparatus of claim 1, wherein the audio signal path portion comprises a power amplifier having an audio output for providing the output signal, and the power amplifier is configured to generate the output signal in conformity with the selectable analog attenuation.

20. The apparatus of claim 1, wherein the audio signal path portion comprises:

a first power amplifier having a first audio output for providing a first amplifier output signal based on the analog input signal and in conformity with a first analog attenuation; and a second power amplifier having a second audio output for providing a second amplifier output signal based on the analog input signal and in conformity with a second analog attenuation;

wherein the audio path signal portion is configured to select one of the first amplifier output signal and the second amplifier output signal as the output signal in conformity with the selectable analog attenuation.

21. The apparatus of claim 1, wherein the DAC is configured to operate in one of a plurality of DAC modes based on the selected analog attenuation such that the DAC generates more noise at a first selectable analog attenuation than at a second selectable analog attenuation, wherein the first selectable analog attenuation is greater than the second selectable analog attenuation.

22. The apparatus of claim 1, wherein the analog signal path portion is configured to operate in one of a plurality of analog modes based on the selected analog attenuation such that the analog signal path portion generates less noise at a first selectable analog attenuation than at a second selectable analog attenuation, wherein the first selectable analog attenuation is greater than the second selectable analog attenuation.

23. A method for providing an output signal to an audio transducer, comprising:

receiving a signal indicative of the output signal;

selecting a selectable analog attenuation based on a magnitude of the signal indicative of the output signal, wherein the output signal is generated based on an analog input signal and in conformity with the selectable analog attenuation;

selecting a selectable digital gain based on a magnitude of the signal indicative of the output signal, wherein a digital audio input signal is converted into the analog input signal in conformity with the selectable digital gain; and modifying a response of the analog audio signal to reduce filtering effects occurring as a result of a change in the selectable digital gain.

24. The method of claim 23, further comprising selecting the selectable analog attenuation and selecting the selectable digital gain such that an analog signal path for generating the output signal from the analog input signal operates at a highest possible attenuation in order to minimize analog noise in the analog signal path portion.

25. The method of claim 23, wherein the signal indicative of the output signal is a sum of the digital audio input signal and a volume control setting signal.

26. The method of claim 23, further comprising selecting the selectable analog attenuation based on a magnitude of a volume control setting signal.

27. The method of claim 23, wherein the product of the selectable digital gain and the selectable analog attenuation is a unity gain.

28. The method of claim 23, further comprising:

selecting a first selectable digital gain as the selectable digital gain and selecting a first selectable analog attenuation as the selectable analog attenuation if the magnitude of the signal indicative of the output signal is above a predetermined threshold; and selecting a second selectable digital gain as the selectable digital gain and selecting a second selectable analog attenuation as the selectable analog attenuation if the magnitude of the signal indicative of the output signal is below the predetermined threshold, wherein the second selectable digital gain is greater than the first selectable digital gain and the first selectable analog attenuation is greater than the second selectable analog attenuation.

29. The method of claim 28, wherein the product of the first selectable digital gain and the first selectable analog attenuation is a unity gain and the product of the second selectable digital gain and the second selectable analog attenuation is a unity gain.

30. The method of claim 28, further comprising:

selecting the first selectable digital gain as the selectable digital gain and selecting a first selectable analog attenuation as the selectable analog attenuation if the magnitude of the signal indicative of the output signal exceeds the predetermined threshold for a first predetermined minimum duration of time; and selecting the second selectable digital gain as the selectable digital gain and selecting a second selectable analog attenuation as the selectable analog attenuation if the magnitude of the signal indicative of the output signal remains below the predetermined threshold for a second predetermined minimum duration of time.

31. The method of claim 30, wherein the first predetermined minimum duration of time and the second predetermined minimum duration of time are approximately equal.

32. The method of claim 28, further comprising selecting the second selectable digital gain as the selectable digital gain and selecting the second selectable analog attenuation as the selectable analog attenuation responsive to the magnitude of the signal indicative of the output signal decreasing below the predetermined threshold and the signal indicative of the output signal crossing a zero crossing level.

33. The method of claim 32, wherein the zero crossing level is zero or a level within a second predetermined threshold of zero and indicative of a zero crossing of the output signal.

34. The method of claim 28, further comprising selecting the first selectable digital gain as the selectable digital gain and transitioning the selectable analog attenuation between the second selectable gain and the first selectable during a duration of time responsive to the magnitude of the signal indicative of the output signal increasing above the predetermined threshold.

35. The method of claim 34, wherein the duration of time models an inverse of a response of a power amplifier to the selection of the first selectable digital gain as the selectable digital gain; wherein the power amplifier is integral to analog signal path portion and configured to generate the output signal.

36. The method of claim 28, further comprising transitioning the selectable digital gain between the second selectable gain and the first selectable gain during a duration of time and transitioning the selectable analog attenuation between the second selectable gain and the first selectable during the duration of time responsive to the magnitude of the signal indicative of the output signal increasing above the predetermined threshold.

37. The method of claim 28, wherein converting the digital audio input signal into the analog input signal comprises:
   receiving the digital audio input signal and generating an interpolated digital audio input signal;
   sample rate converting the interpolated digital audio input signal; and
   modulating the sample rate converted interpolated digital audio input signal to generate the audio output signal; and
   wherein the method further comprises:
      predicting a transition of the signal indicative of the audio output signal from below the predetermined threshold to above the predetermined threshold based on at least one of the digital audio input signal and the interpolated digital audio input signal; and
      transitioning the selectable digital gain between the second selectable digital gain and the first selectable digital gain in response to prediction of the transition of the signal indicative of the audio output signal from below the predetermined threshold to above the predetermined threshold.

38. The method of claim 37, further comprising:
   defining at least one buffer region of the sample rate converted interpolated digital audio input signal, wherein the selectable digital gain is selected to be a buffer region selectable gain greater than the second selectable gain and lesser than the first selectable gain when the sample rate converted interpolated digital audio input signal is within the buffer region; and
   transitioning the selectable analog attenuation between the buffer region selectable gain and the first selectable gain during a duration of time responsive to the sample rate converted interpolated digital audio input signal being within the buffer region.

39. The method of claim 23, wherein modifying the response of the analog audio signal comprises applying a pre-correction factor to the analog audio signal to account for filtering occurring in an analog signal path for generating the output signal from the analog input signal as a result of decrease in the selectable digital gain from a first selectable digital gain to a second selectable digital gain.

40. The method of claim 23, further comprising:
   generating, by an analog signal path for generating the output signal from the analog input signal, the output signal in conformity with the selectable analog attenuation; and
   wherein modifying the response of the analog audio signal comprises altering the response of the analog signal path to reduce low-pass filtering effects of a power amplifier integral to the analog signal path in response to decrease in the selectable digital gain from a first selectable digital gain to a second selectable digital gain.

41. The method of claim 23, wherein generating the output signal from the analog input signal comprises:
   providing a first amplifier output signal based on the analog input signal and in conformity with a first analog attenuation;
   providing a second amplifier output signal based on the analog input signal and in conformity with a second analog attenuation; and
   selecting one of the first amplifier output signal and the second amplifier output signal as the output signal in conformity with the selectable analog attenuation.

42. The method of claim 23, further comprising operating a digital-to-analog converter (DAC) for converting the digital audio input signal into the analog input signal in one of a plurality of DAC modes based on the selected analog attenuation such that the DAC generates more noise at a first selectable analog attenuation than at a second selectable analog attenuation, wherein the first selectable analog attenuation is greater than the second selectable analog attenuation.

43. The method of claim 23, further comprising operating an analog path portion for generating the output signal from the analog input signal based on the selected analog attenuation such that the analog signal path portion generates less noise at a first selectable analog attenuation than at a second selectable analog attenuation, wherein the first selectable analog attenuation is greater than the second selectable analog attenuation.

* * * * *